United States Patent
Jokinen et al.

(10) Patent No.: US 9,437,299 B2
(45) Date of Patent: Sep. 6, 2016

(54) SYSTEMS AND METHODS FOR ORDER SCOPE TRANSITIONS USING CAM

(71) Applicants: Tommi M. Jokinen, Austin, TX (US); John F. Pillar, Ottawa (CA)

(72) Inventors: Tommi M. Jokinen, Austin, TX (US); John F. Pillar, Ottawa (CA)

(73) Assignee: Freescale Semiconductor, Inc., Austin, TX (US)

( * ) Notice: Subject to any disclaimer, the term of this patent is extended or adjusted under 35 U.S.C. 154(b) by 415 days.

(21) Appl. No.: 14/230,255

(22) Filed: Mar. 31, 2014

(65) Prior Publication Data
US 2015/0279465 A1  Oct. 1, 2015

(51) Int. Cl.
*G06F 9/50* (2006.01)
*G11C 15/00* (2006.01)
*G11C 7/10* (2006.01)

(52) U.S. Cl.
CPC ............. *G11C 15/00* (2013.01); *G06F 9/5038* (2013.01); *G11C 7/1006* (2013.01)

(58) Field of Classification Search
None
See application file for complete search history.

(56) References Cited

U.S. PATENT DOCUMENTS

| 7,895,431 | B2 | 2/2011 | Lee et al. | |
|---|---|---|---|---|
| 8,089,793 | B1 | 1/2012 | Gharia | |
| 8,176,242 | B1 | 5/2012 | Shamis et al. | |
| 2004/0187112 | A1* | 9/2004 | Potter, Jr. | G06F 9/4843 718/100 |
| 2010/0281483 | A1* | 11/2010 | Rakib | G06F 9/3009 718/102 |

FOREIGN PATENT DOCUMENTS

EP  1460640  5/2005

* cited by examiner

*Primary Examiner* — Charles Rones
*Assistant Examiner* — Hewy Li

(57) ABSTRACT

A data processing system includes a content addressable memory (CAM). Each entry of the CAM corresponds to a task and is configured to store a current scope of each task. A random access memory (RAM) is configured to shadow information of the CAM. Transition position storage circuitry is configured to store transition age positions for tasks. Control circuitry is configured to, in response to a command to transition a selected task to a destination scope, access the RAM to determine the current scope for the selected task, use the current scope to perform a match determination with the CAM to determine if any entries corresponding to tasks other than the selected task match the current scope; and for any matching entries, updating a transition age position in the transition position storage circuitry for the corresponding task within the current scope.

20 Claims, 7 Drawing Sheets

FIG. 6

| 316 | $T_0$ | $T_1$ | $T_2$ | $T_3$ | $T_4$ | $T_5$ | $T_6$ | $T_7$ | $T_8$ | $T_9$ |
|---|---|---|---|---|---|---|---|---|---|---|
| TASK 2 | $^R B_0$ | $B_0$ | $\to^R B_0$ | $^R A_{1,1}$ | $A_{1,0}$ | $^E_{\uparrow D_0} A_{0,0}$ | $^x A_{0,0}$ | $\to^A A_{0,x}$ | $\to^{E\ R} C_0$ | $\to^x -$ |
| TASK 1 | $A_{1,1}$ | $^R A_{1,0}$ | $A_{0,0}$ | $A_{0,0}$ | $\to^A A_{0,x}$ | $\to^E C_1$ | $C_0$ | $^{E\ R} D_1$ | $D_0$ | $\to^x -$ |
| TASK 0 | $^{R\to A} A_{0,0}$ | $\to^A A_{0,x}$ | $\to^R B_1$ | $B_0$ | $^{C_0}_{\uparrow E} B_0$ | $^{C_0} B_0$ | $^x B_0$ | $\to^{E\ R} D_0$ | $\to^x -$ | $-$ |

FIG. 7

| 304 | $T_0$ | $T_1$ | $T_2$ | $T_3$ | $T_4$ | $T_5$ | $T_6$ | $T_7$ | $T_8$ | $T_9$ |
|---|---|---|---|---|---|---|---|---|---|---|
| TASK 2 |  |  |  | A |  |  |  |  | C |  |
| TASK 1 |  |  |  |  |  |  | C |  | D |  |
| TASK 0 |  |  | B |  |  |  |  |  | D |  |

SYSTEMS AND METHODS FOR ORDER SCOPE TRANSITIONS USING CAM

FIELD OF THE DISCLOSURE

This disclosure generally relates to data processing, and more particularly to a system and method for order scope transitions using content-addressable memory (CAM).

BACKGROUND

Multi-core processing systems often perform operations on packet data, wherein the packet data of a received packet is associated with a particular program identifier (program ID) that indicates a particular program to be executed by a core to process the packet data. A task manager or work scheduler can assign a particular core to execute the particular program that is to process the packet data. This combination of a particular program and corresponding data packet represents a specific task that is to be executed by the processing system, and in particular, once assigned to a specific core, this combination represents a specific task of that core, wherein the core can be assigned multiple tasks.

A particular task may be divided into one or more portions that are referred to as order scopes, wherein when a task has multiple order scopes, each order scope represents a portion of an operation to be performed by the task. For example, each order scope can correspond to a portion of the task's program code that is executed by the core. An order scope can also correspond to an operation during which control has been transferred by the core to a non-core resource, such as to a hardware accelerator, to execute on the packet data. Note that when a task portion is being executed by a non-core resource, the core assigned to process the task does not need to be actively processing that task. In such case, the core can be used to execute another one of its tasks, and continue executing the task when the task's order scope associated with the non-core resource is finished executing on the packet data.

A processor core can switch between tasks on order scope boundaries, e.g., after completion of one order scope and before starting a next order scope; and, therefore, the processor core needs to be able to store context information, e.g., state information, for a current task of a core before it exits the current task. This process of a core saving context information for an executing task to allow a different task to be processed by the core is generally referred to as context/task switching. Task switching provides a benefit of enabling a processor core to execute multiple tasks in a time-sliced manner.

An Order scope Manager (OSM) processes commands from multiple cores with multiple active threads or tasks. Commands that require a scope change or exclusivity require the core to yield to other tasks while waiting for a response (release). The latency of this response is not critical since the core is busy processing other tasks. The main concern is the throughput of the OSM considering the number of active tasks can be high.

BRIEF DESCRIPTION OF THE DRAWINGS

The present disclosure may be better understood, and its numerous features and advantages made apparent to those skilled in the art by referencing the accompanying drawings.

FIG. 6 illustrates a diagram of a scope Random Access Memory (RAM) that can be used in the order scope manager of FIG. 3 in accordance with at least one embodiment of the present disclosure.

FIG. 7 illustrates a diagram of a destination RAM that can be used in the order scope manager of FIG. 3 in accordance with at least one embodiment of the present disclosure.

The use of the same reference symbols in different drawings indicates similar or identical items.

DETAILED DESCRIPTION OF THE DRAWINGS

A data processing system is disclosed that includes a processor having a work scheduler, an order scope manager, and multiple processor cores. A content addressable memory (CAM) is used to store and match order scope IDs to determine ordering requirements with respect to other tasks. Read, write and compare operations are performed in the CAM, typically with 1 or 2 cycles of latency. During order scope transitions where a processor switches from one order scope to another, multiple operations may be required, for example, to read the current scope, increment the current scope and compare the incremented current scope to CAM module contents to determine a match. Some of the CAM module operations must be performed sequentially, which affects overall through put of utilization of the CAM. Throughput and utilization of the CAM module is improved by adding an SRAM in the pipeline which shadows the CAM module data and provides the scope identifier for read operations. The CAM module then only needs to perform write and compare operations.

Figure 1:
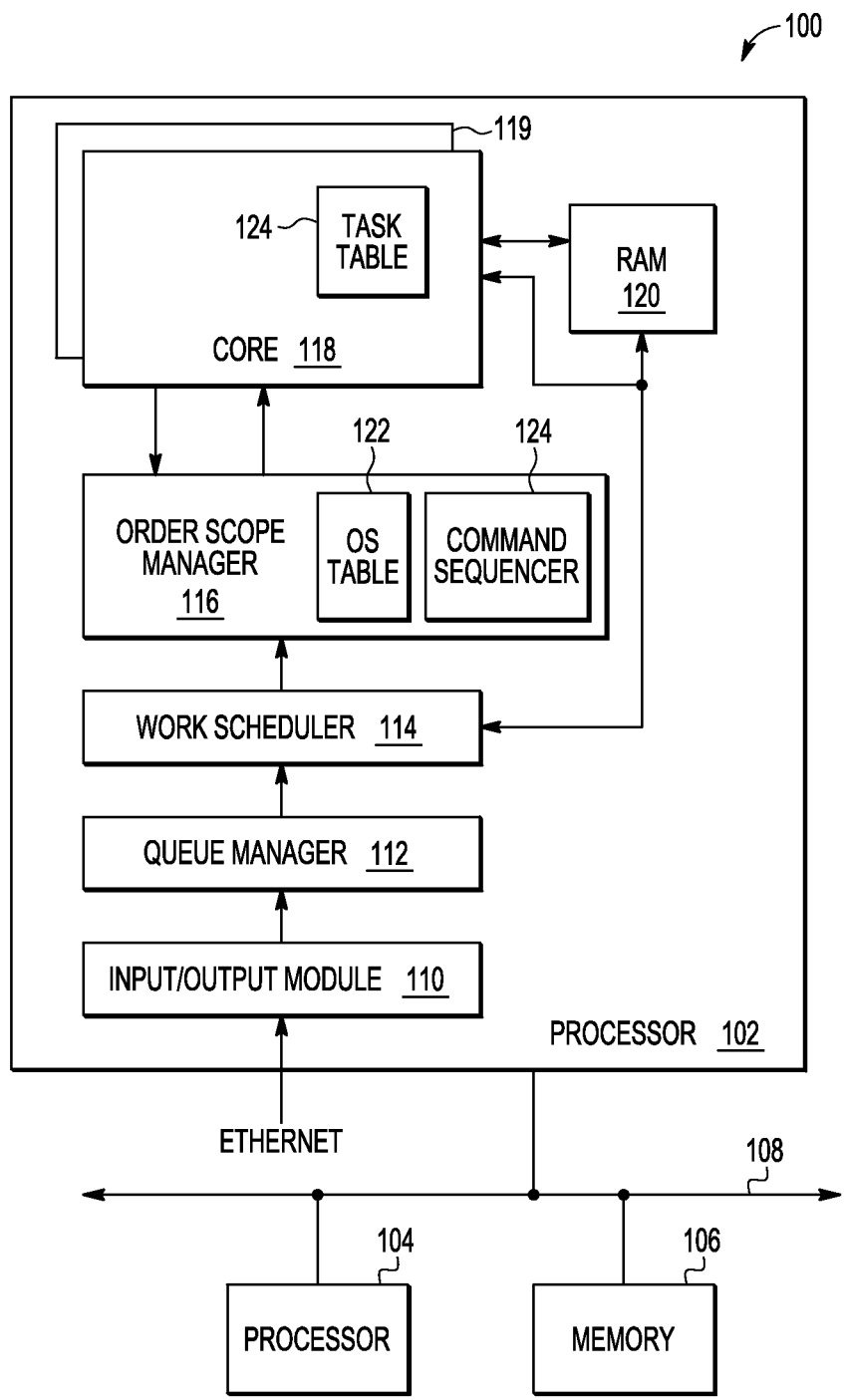
FIG. 1 illustrates a data processing system in accordance with at least one embodiment of the present disclosure.

FIG. 1 shows a data processing system 100 in accordance with at least one embodiment of the present disclosure. The data processing system 100 includes processors 102 and 104, a memory 106, and a communication bus 108. The processor 102 includes an input/output module 110, such as Wire Rate Input/Output Processor (WRIOP) or Advanced Input/Output Processor (AIOP), a queue manager 112, a work scheduler 114, an order scope manager 116, multiple processor cores including cores 118 and 119, and a random access memory (RAM) 120. The order scope manager 116 includes an order scope table 122 and a command sequencer 124.

In an embodiment, the various features of processor 102, such as order scope manager 116, cores 118 and 119, can be general purpose processor special purpose processors, state machines, and/or other types of logic circuits capable of performing operations on data cores 118 and 119. Each of the multiple cores can be presumed to be similar to core 118, and includes a task table 124 that includes information about its assigned tasks.

The processors 102 and 104 can communicate with each other via bus 108, and can store data to or receive data from the memory 106 via the bus 108. The processor 102 can also receive and send data packets, such as Ethernet data packets, from/to other devices via the input/output module 110, which for purposes of illustration is not connected to the bus 108. The input/output module 110 classifies received Ethernet packets (data packets) and provides the packets to the queue manager 112, which in turn stores the data packet in a queue. During classification, the input/output module 110 can evaluate header information of a received data packet to determine a program to process the packet and to assign to the packet data a particular program ID identifying the program. Examples of various programs that can execute on a data packet include decryption, de-compression, compression, among others. The queue manager 112 can create/remove queues to store the data packets based on the number of packet streams received at the processor 102. Thus, upon classification, the data packet is assigned to an existing queue for that particular data stream, or a new queue is created to which the data packet is assigned.

After data packets are placed in a queue, the work scheduler 114 can assign each of the data packets, on a packet-by-packet basis, and a corresponding program to a task that is in turn assigned to a processor core. The work scheduler can provide task specific information to the order scope table 122 and to a task table 124 of one of the processor cores. An example of information stored at order scope table 122 is illustrated at Table 1, which includes entries for active tasks at a time T0. A column of Table 1 labeled "Task" lists unique task identifiers (Task IDs) of the processing system, where each row is associated with a different task. It will be appreciated that because there is a one-for-one relationship between tasks and entries of the order scope table 122, that an actual Task ID need not actually be stored at the order scope table 122, e.g., the first entry of table 122 is understood to correspond Task 0. Note that for convenience, only the active tasks of the order scope table 122 are illustrated at Table 1.

TABLE 1

Order scope table (Time T0)

| Task | OS ID | Exclusive | Transition Position | Exclusive Position |
|------|-------|-----------|---------------------|--------------------|
| Task 0 | A | 1 | 0 | 0 |
| Task 1 | D | 1 | 0 | 0 |
| Task 2 | A | 1 | 1 | 1 |
| Task 3 | F | 0 | 0 | X |
| Task 4 | A | 0 | 2 | X |

The column of Table 1 labeled "Exclusive" indicates whether a corresponding task needs to operate in an exclusive mode. According to a specific embodiment, only one current task can execute exclusively in a given order scope at a time. Conversely, any number of tasks can execute non-exclusively (concurrently) in a given order scope. Thus, multiple tasks can execute non-exclusively in the same order scope—either by themselves or with one task executing exclusively in the same order scope. In the specific embodiment of Table 1, A is the active order scope for Task0, Task2, and Task4, wherein requests to execute Task0 and Task2 indicated that they are both to exclusively operate in A exclusively, and Task4 is to operate non-exclusively in A. Note that information as to whether a task is to exclusively execute in a particular order scope is defined by the tasks program in a manner determinable by the order scope manager 116.

A column of Table 1 labeled "Transition Position" indicates a relative the order that tasks are enabled for execution. Thus, in Table 1, because no task has been enabled, a value of X is stored at each active task entry. A column of Table 1 labeled "Exclusive Position" indicates a relative order that tasks to be exclusively executed are to be enabled for exclusive execution in the order scope. By way of example, the order is presumed to be the same order as the tasks became pending. Thus, in Table 1, a value of zero (0) is stored at Task0 and Task1 to indicate they are first-in-order, relative to their order scope, for exclusive execution because all of the active tasks are pending, and a value of one (1) is stored at Task1 to indicate it will exclusively execute in A after Task0.

In addition to updating the order scope table as packets are assigned to tasks, the work scheduler 114 also assigns the tasks to processor cores for execution. For example, each task assigned to processor core 118 by the work scheduler 114 is stored in a corresponding entry of task table 124. For example, Table 2 illustrates the state of task table 124 of processor core 118 at time T0, wherein processor core 118 has been assigned tasks Task0, Task1, and Task2, as indicated by the task identifiers listed in the column labeled "Task".

TABLE 2

Task Table 124 for Processor Core 118 (Time T0)

| Task | Data Packet | Exclusive | Order scopes |
|------|-------------|-----------|--------------|
| Task 0 | DP1 | 0 | A, B, C |
| Task 1 | DP2 | 0 | D, E |
| Task 2 | DP4 | 0 | A, B, C |

The work scheduler 114 further stores task information at each core's task table 124 that identifies the packet data being processed by the corresponding task, wherein this information can be used to access the actual packet data. For example, the column of Table 2 labeled "Data Packet" indicates the packet data being processed by each assigned task. In operation, this information can be an address, or other information that can be used to determine the address where the packet data is stored. Thus, the packet data for packet DP1 is to be processed by Task0, the packet data for a packet DP2 is to be processed by Task1, and the packet data for a packet DP4 is to be processed by Task2. The work scheduler 114 also stores information at the task table that indicates the location of the program code corresponding to the task that is to be used by the processor core to process the packet data.

By way of example, this information is represented at Table 2 in the column labeled "Order scopes". It will be appreciated, that only information indicating the program code location of the current ordering needs be included in the task table 124, but for convenience of discussion, all of the order scopes of each task are indicated. Thus, Task0 comprises three order scopes: A, B, and C; Task1 comprises two order scopes D and E; and Task2 comprises three order scopes: A, B, and C. Note, that the programs being executed by Task0 and Task2 execute different instantiations of the same program code, and therefore have the same order scopes.

The order scopes can be defined by the program code based upon an understanding of a programmer or compiler as to the resources needed by particular code portions when executed by a task. The order scopes of a task can be indicated in the task code through the use of order scope transition instructions placed in the task code by command sequencer 124 at an order scope boundary, such as the last instruction of an order scope. An order scope transition instruction can indicate a next order scope to be executed, and whether the next order scope is to be exclusively executed. Multiple tasks are not allowed to exclusively execute in the same order scope at the same time, thereby avoiding conflicts. Conversely, multiple tasks are allowed to non-exclusively execute in the same order scope concurrently, along with up to one (1) exclusive order scope.

Work scheduler 114 can assign a task to a particular core based on the software needed to perform the task, the availability of the each processor core, and the like. The work scheduler 114 can continue defining and assigning tasks until no more data packets remain unassigned in the processor 102 or until all of the task table's entries of the processor cores are full, e.g., all available tasks have been assigned. In an embodiment, each processor core can have up to sixteen tasks assigned—one to each entry of its task table, wherein the data processing system 100 could have up to two hundred and fifty-six possible tasks—each one corresponding to an entry of the order scope table 122.

As described above, the work scheduler 114 can assign tasks to one or more processor cores 102. Note that the work scheduler 114 can also retrieve the packet data from a queue, and store the packet data for each of the tasks in the RAM 120.

Order scope manager 116 controls when tasks can execute a given order scope. For example, the order scope manager 116 can select one task to exclusively execute a particular order scope from amongst a plurality of tasks waiting to exclusively execute in the same order scope.

Figure 2:
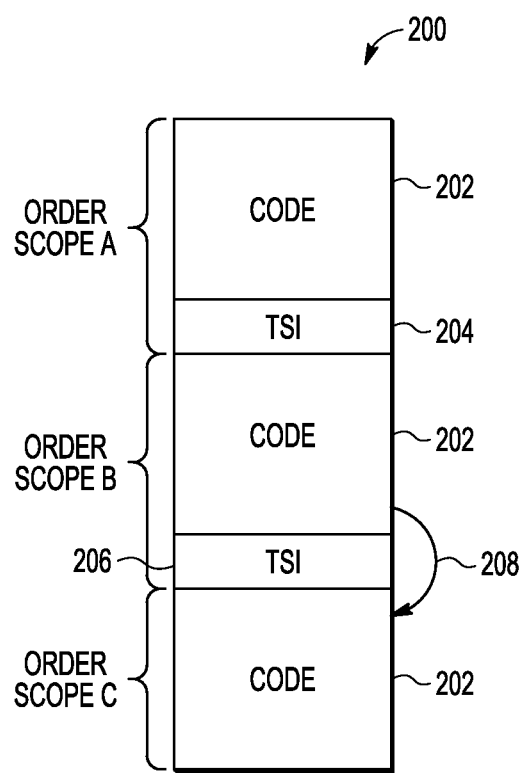
FIG. 2 illustrates the set of instructions of a task executed in a processor core of the data processing system of FIG. 1 in accordance with at least one embodiment of the present disclosure.

The enabled processor cores 118 and 119 can begin execution of a task by loading the program code, e.g., instructions, for their respective task. For example, FIG. 2 illustrates a set of instructions 200 being executed at processor core 118, wherein the set of instructions 200 corresponds to Task0, and includes three code portions 202, each of which correspond to an order scope, such as order scopes A, B, and C. Between code portions 202 of a task there is a task switch instruction, instructions 204 and 206, illustrated as the last command of A and B, respectively, which can cause the processor core 118 to perform a task switch when the processor core 118 completes execution of one order scope and before the processor core 118 starts execution of the next-in-order order scope.

The processor core 118 can execute the code 202 in order scope A and can then begin the execution of the task switch instruction 204. The task switch instruction 204 can include an incremental transition command, which can cause the processor core 118 to perform an incremental order scope transition and complete the task switch instruction.

Figure 3:
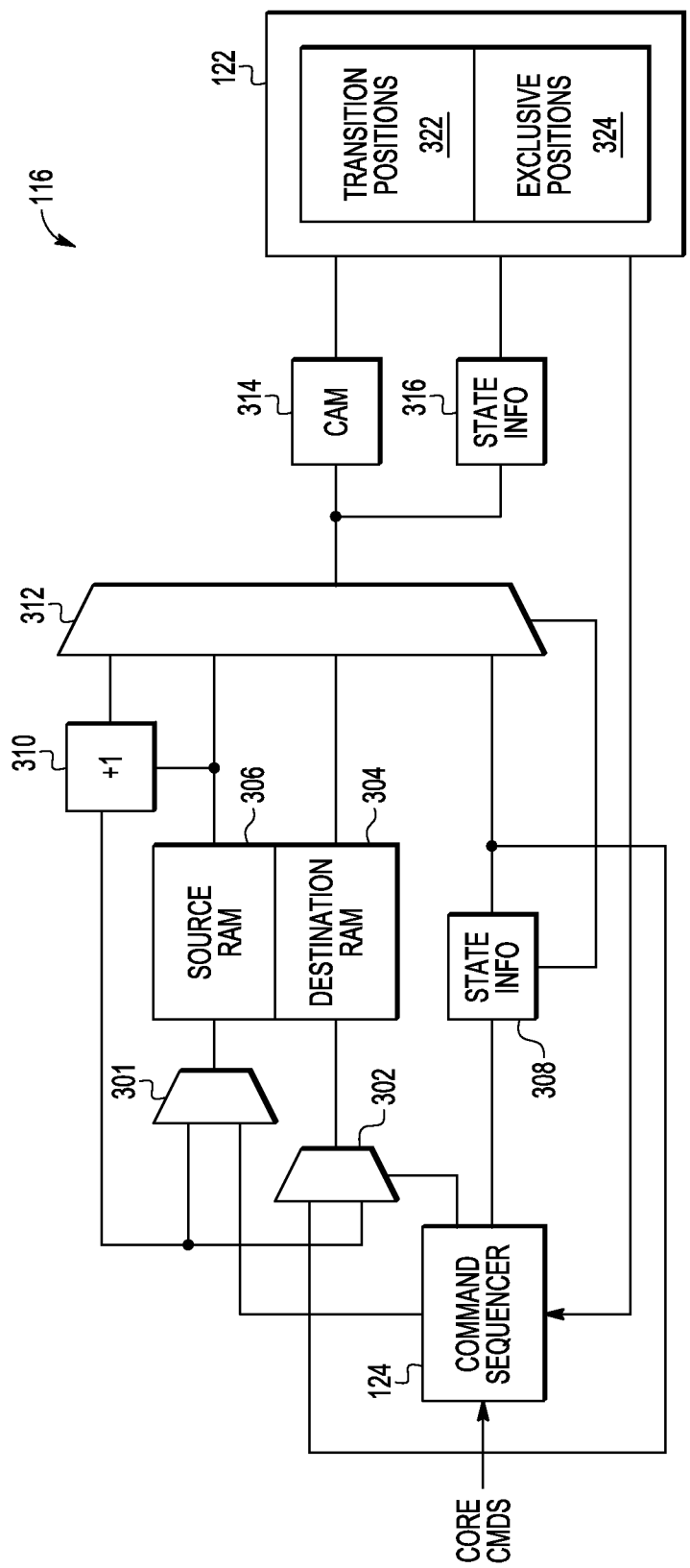
FIG. 3 illustrates an order scope manager in accordance with at least one embodiment of the present disclosure that can be used in the processing system of FIG. 1.

FIG. 3 illustrates an order scope manager 116 in accordance with at least one embodiment of the present disclosure that can be used in the processing system 100 of FIG. 1 including command sequencer 124, multiplexers 301, 302, RAM modules 304, 306, state information 308, order scope increment module 310, multiplexer 312, CAM module 314, state information 316, and order scope table 122 including transition positions 322 and exclusive positions 324. Command sequencer 124 is configured to receive commands from core 118 (FIG. 1) and information regarding transition positions 322 and exclusive positions 324 from order scope table 122.

Commands from core 118 to command sequencer 124 can include, for example, ENTER, RELINQUISH, EXIT, and TRANSITION, among others, as further described herein. Destination RAM module 304 stores destination order scopes when a TRANSITION command is received for a task. Source RAM module 306 stores a copy of the information provided to CAM module 314. Command sequencer 124 provides information to state information 308 that is used to update CAM module 314. Command sequencer 124 provides a control signal to multiplexer 301 to select between an order scope input from state information 308 and an incremented order scope provided by incrementer 310. Command sequencer 124 provides a control signal to multiplexer 302 to select between an order scope input from command sequencer 124 and an incremented order scope provided by incrementer 310.

Multiplexer 312 has a first input coupled to an output of the order scope increment module 310, a second input coupled to an output of destination RAM module 304, a third input coupled to output of source RAM module 306, and a fourth input coupled to state information 308. The output of multiplexer 312 is controlled by a signal from state information 308 based on information that needs to be updated in CAM module 314 to store the same information in CAM module 314 as in source RAM module 306 and to update state information 316.

State information 308 is used to store command information and control signals. Other suitable information can be stored in state information 308 in addition to or instead of the foregoing information. State information 316 can store some or all of the information stored in state information 308.

The entries in CAM module 314 are used to determine transition positions 322 and exclusive positions 324 of the order scopes. A first set of sums of all the same valid exclusive order scopes for tasks to be executed and a second set of sums of all the same valid non-exclusive order scopes are determined for the tasks to be executed are generated. The first sum is used to determine the positions of order scopes in exclusive positions 324 and the second sum is used to determine the positions of order scoped in transition positions 322.

For example, in Table 2, Task0 and Task2 each execute in order scopes A, B and C. As Task0 completes execution in order scope A, which will be in a first position, the order scope A for Task0 will exit and the order scope A for Task2 will move from a second to the first position in transition positions 322. Note that Task0 and Task2 can execute concurrently in order scopes A, B and C, and the position of an order scope can change if one task finishes executing in an order scope before the other task. When two tasks execute in an order scope that is exclusive, however, one task will wait until the other task is finished executing in the exclusive order scope.

When an enter with increment command is received, order scope increment module 310 increments a level of the specified order scope due to the order scope being encapsulated in (or invoked by) another order scope. The encapsulating order scope will have a lower level than the encapsulated order scope. Any suitable number of levels may be made available as required by the encapsulating levels in the tasks and order scopes.

Source RAM module 306 stores a copy of the information CAM module 314 and can be accessed by command sequencer 124 to read the IDs of the order scopes to determine whether there is a match in CAM module 314 with an order scope of a different task. Configuring the source RAM module 306 with the same information as the CAM module 314 allows read operations to be offloaded to the source RAM module 306 while the CAM module 314 still handles write and compare operations. The throughput of the CAM modules 314 is thus increased.

Figure 4:
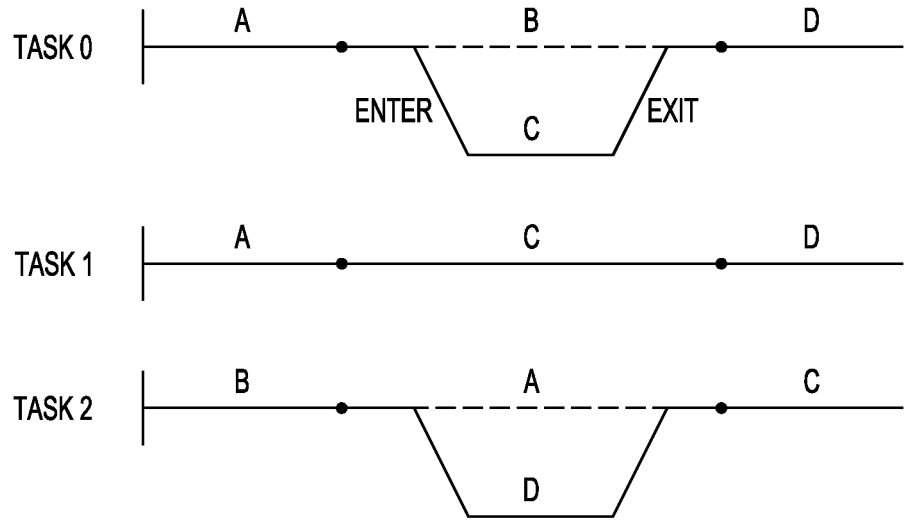
FIG. 4 illustrates a sequence of logical scope boundaries for three separate tasks that can be executed by the data processing system of FIG. 1 in accordance with at least one embodiment of the present disclosure.
Figure 5:
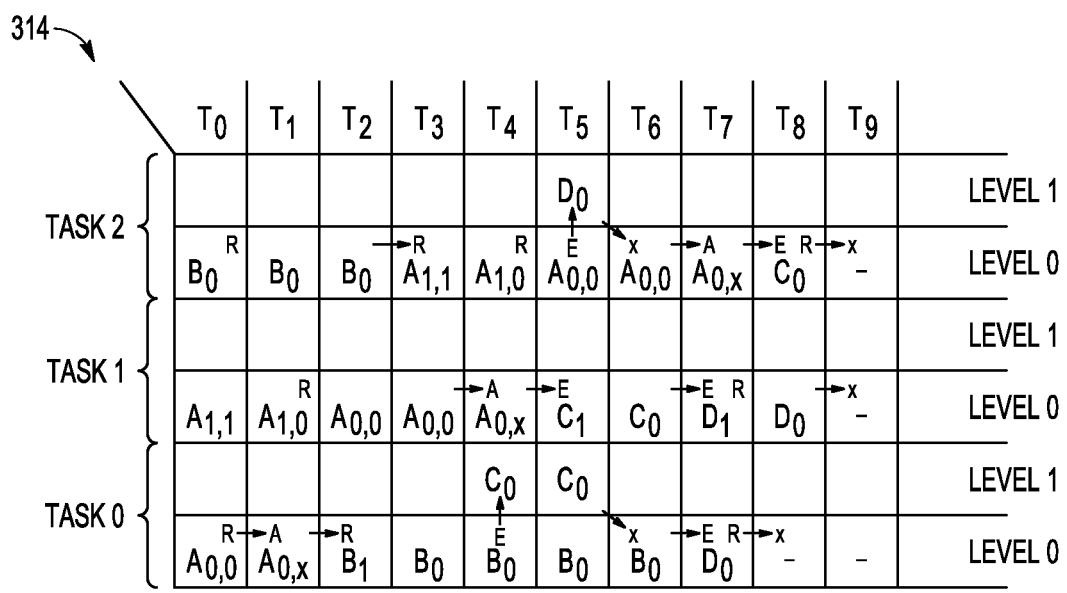
FIG. 5 illustrates a diagram of a Content Addressable Memory (CAM) that can be used in the order scope manager of FIG. 3 in accordance with at least one embodiment of the present disclosure.
Figure 8:
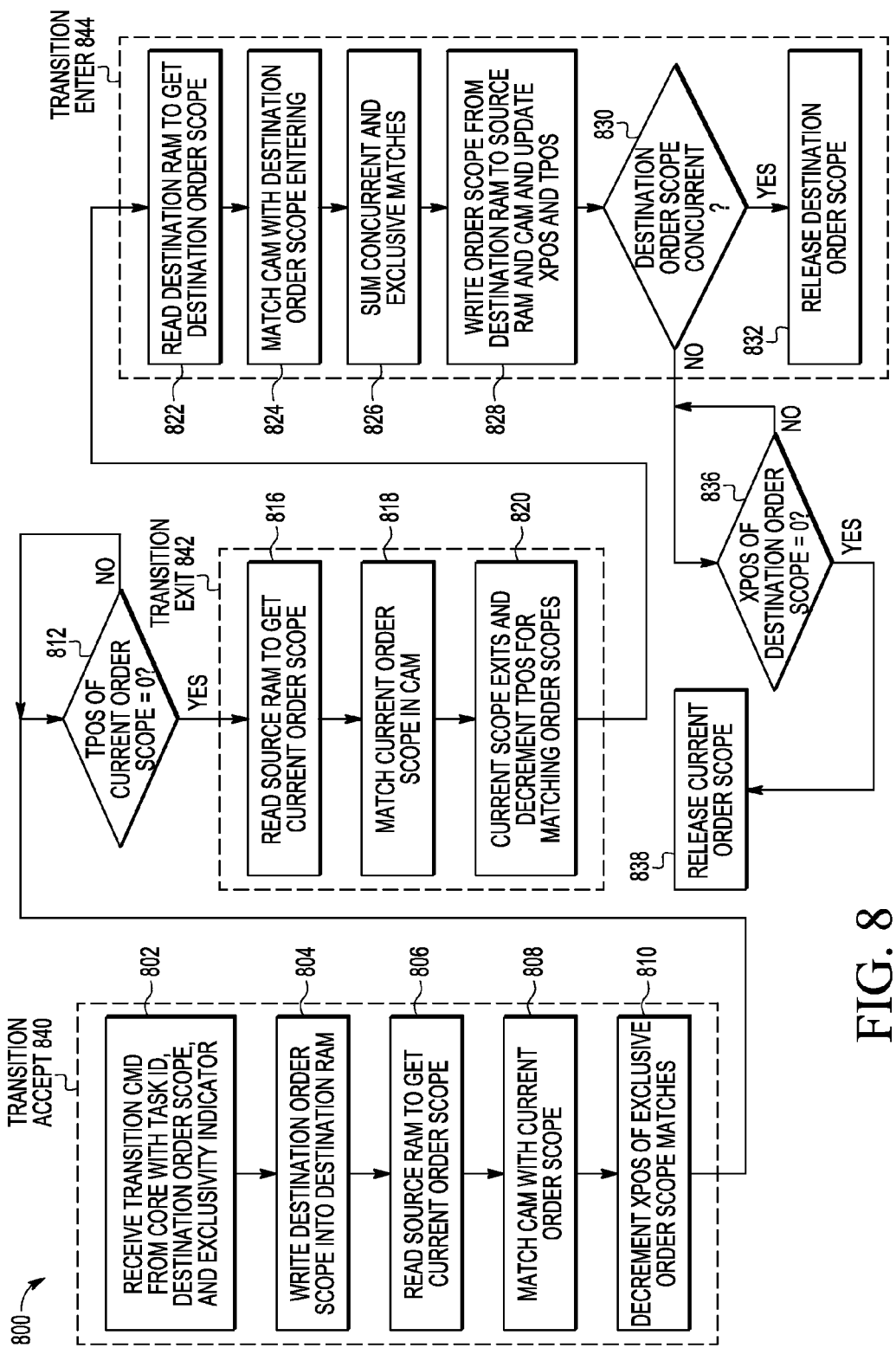
FIG. 8 illustrates a flow diagram of a method for performing a transition command that can be used in the order scope manager of FIG. 3 in accordance with at least one embodiment of the present disclosure.

Referring to FIGS. 4 and 5, FIG. 4 illustrates a sequence of order scopes for three separate tasks (Task0, Task1, Task2) that can be executed by the data processing system 100 of FIG. 1 in accordance with at least one embodiment of the present disclosure. In the example shown, Task0 executes in order scopes A, B, C and D. Order scope C is encapsulated by order scope B. Task0 executes sequentially in order scopes A, B and D, but executes in order scope C at some point while executing in order scope B. Order scope B is shown at a first level and order scope C is shown at a second level in FIG. 4. A dashed timeline is shown for order scope B while executing in order scope C to indicate that Task0 enters and exits order scope C while executing in order scope B. Task1 executes sequentially in order scopes A, C and D. Task2 executes sequentially in order scopes E, A and C, but executes in order scope D at some point while executing in order scope A. Order scope A is shown at a first level and order scope D is shown at a second level in FIG. 4. A dashed timeline is shown for order scope A while executing in order scope D to indicate that Task2 enters and exits order scope D while executing in order scope A. For all the tasks in the example shown, order scope A is exclusive while order scopes B, C, D and E can execute concurrently.

FIG. 5 illustrates a diagram of an embodiment of Content Addressable Memory (CAM) module 314 at various time periods T0 through T9 while Task0, Task1, and Task2 of FIG. 4 are executing that can be used in the order scope manager 116 of FIG. 1. In the example shown, order scope A is exclusive and all other order scopes are concurrent. A first subscript by each order scope indicates a transition position of the order scope. An order scope must be in a first transition position (subscript 0) to exit. A second subscript by each order scope indicates an exclusive position of the order scope, if applicable. Since order scope A is the only exclusive order scope in the example shown, only order scope A is shown with the second subscript.

Two levels (0 and 1) of encapsulation are shown in the example of FIG. 4 for order scopes B and C of Task0 and order scopes A and D of Task2, however, CAM module 314 can have any suitable number of levels depending on the level of encapsulation for the order scopes.

During execution of Task0, order scopes A, B and D are in Level 0 and order scope C is in Level 1 since order scope C is encapsulated by order scope B. Task0 executes in order scope A during time periods T0 and T1, in order scope B during time periods T2 through T6, in order scope C during time periods T4 and T5, and in order scope D in time period T7. Order scope B is shown with a superscript R in time period T2 indicating Task0 can begin executing in order scope B. Core 118 issues an enter incremental command to transition from order scope B and execute in order scope C. Core 118 issues an exit command when finished executing in order scope C, causing a transition back to order scope B. Task0 finishes executing in order scope B in time period T6 and transitions to executing in order scope D during time period T7. Order scope D is shown with a superscript R to indicate Task0 can start executing in order scope D.

Task1 executes sequentially in order scopes A, C and D, which are in Level 0. Task1 is delayed from executing in order scope A until time period T1 because order scope A is exclusive and Task0 is executing in order scope A during time period T0. Task 1 executes in order scope A during time periods T1 through T4. Note that order scope A for Task0 is in the first exclusive position during time period T0 while order scope A for Task1 is in the second exclusive position during the same time period. Once Task0's transition command is accepted for order scope A, order scope A is released and the exclusive position for order scope A is decremented to the first position and released for Task1 to begin executing in order scope A. During time periods T5 and T6, Task1 executes in order scope C, which is shown with a subscript "1" during time period T5 to indicate order scope C is in the second transition position due to order scope C for Task0 being in the first transition position. Tasks 0 and 1 can execute in order scope C concurrently since order scope C is non-exclusive. The transition position of order scope C for Task1 is decremented to the first transition position once Task0 exits order scope C at the end of time period T6. Task1 finishes executing in order scope C in time period T6 and transitions to executing in order scope D during time periods T7 and T8. Tasks 0 and 1 execute in order scope D concurrently. Order scope D is shown with a subscript "1" during time period T7 for Task1 to indicate order scope D is in the second transition position due to order scope D for Task0 being in the first transition position.

During execution of Task2, order scopes A, B and C are in Level 0. Task2 executes in order scope B during time periods T0 through T2, in order scope A during time periods T3 through T7, and order scope C during time period T8. Order scope A is in the second transition position during time periods T3 and T4 and in the first transition position during time periods T5 through T7. Order scope A is further in the second exclusive position during time period T3 and in the first exclusive position during time periods T4 through T6. Order scope D is in level 1 during time period T5 since order scope D is encapsulated by order scope A. Task2 executes in order scope B during time periods T0-T2. Order scope A for Task1 is in the first exclusive position during time period T1-T3, so Task2 is then delayed from executing in order scope A until time period T4 because order scope A is exclusive and Task1 is executing in order scope A until time period T3. Order scope D is encapsulated by order scope A, so core 118 sends an enter incremental command to allow Task2 to execute in order scope D during time period T5. Core 118 issues an exit command when finished executing order scope D at the end of time period T5 to continue executing in order scope A during time period T6-T7. Task2 transitions from order scope A to start executing in order scope C at time period T8.

FIG. 6 illustrates a diagram of a scope Random Access Memory (RAM) module 306 that can be used in the order scope manager of FIG. 3 in accordance with at least one embodiment of the present disclosure. The contents of source RAM module 306 are the same as the contents of CAM module 314 shown in FIG. 5 so that information can be read from source RAM module 306 while CAM module 314 is used concurrently for other operations such as write and compare operations.

Referring to FIGS. 4 and 5, FIG. 7 illustrates a diagram of a destination RAM module 304 that can be used in the order scope manager of FIG. 3 in accordance with at least one embodiment of the present disclosure. When a task transitions between order scopes, destination RAM module 304 is used to store the destination order scope for each transition. The destination order scopes are written by command sequencer 124 when a transition command is received. In the example shown, Task0 transitions from order scope A to order scope B at time T2 and to order scope D at time T8. Task1 transitions from order scope A to order scope at time T6 and to order scope D at time T8. Task2 transitions from order scope B to order scope A at T3 and to order scope C at T9.

Referring to FIGS. 5, 6, 7 and 8, FIG. 8 illustrates a flow diagram of a method 800 for performing a transition command that can be used in the order scope manager 116 of FIG. 1 in accordance with at least one embodiment of the present disclosure. In the example shown, a transition command includes three separate operations shown as transition-accept 840, transition-exit 842, and transition-enter 844.

During transition-accept 840, process 802 includes receiving the transition command from a core with a task identifier, a destination order scope, and an exclusivity indicator for the destination order scope. Using the transition from order scope A to order scope B for Task0 in FIG. 5 as an example, the current order scope at time T0 is A and a transition command is received with the destination order scope B, which is not exclusive. In process 804, order scope B is written in destination RAM module 304 at time T2. Process 806 includes reading the current order scope A from source RAM module 306. Process 808 includes comparing the current order scope A with the order scopes for all tasks in CAM module 314.

If any of the order scopes for all the other tasks present during that time period match the current order scope, and the order scope is exclusive, then process 810 includes decrementing the exclusive position of the order scopes that match the current order scope and entering the order scope with the new exclusive position in the subsequent time period in source RAM module 306 and CAM module 314. For example, the current order scope A for Task0 is changed from a first (or oldest age) exclusive position at time T0 to a null or nonexistent exclusive position at time T1. Order scope A for Task1 is in the second exclusive position (or second oldest age) at time T0 and is decremented to the first exclusive position at time T1.

Before an order scope can exit during a transition, process 812 determines whether the transition position of the order scope is in the first position. As an example, the transition position of order scope A for Task0 is in the first position (shown by a subscript "0"), so process 812 can proceed directly to process 816 in the transition-exit operation 842. Otherwise, process 812 waits unit the current order scope is in the first transition position before proceeding to process 816.

Determining the transition position and exclusive position (if applicable) of an order scope in process 812 can also be referred to as determining the age of the order scope for a task relative to the age of the same order scope for the other tasks the include the order scope. Thus, a transition age position and an exclusive age position (if applicable) can be associated with an order scope.

Process 816 includes reading source RAM module 306 to get the current order scope, which in the example of FIG. 5 is order scope A at time T0. Process 818 includes matching the current order scope with order scopes for all tasks in CAM module 314 at time T0. Process 820 includes exiting the current order scope and decrementing the transition position of the matching order scopes. In the example of FIG. 5, order scope A exits at time T1 for Task0, and the transition position of matching order scope A for Task1 is decremented from second position to first position at time T2 to complete the transition-exit operation 842.

At the start of the transition-enter operation 844, process 822 includes reading the destination order scope for the task from destination RAM module 304. In the example shown in FIGS. 5 and 7, the destination order scope is order scope B for Task 0 at time T2. Process 824 determines whether the entering destination order scope matches any entries in CAM module 314 at the current time period. Process 826 can then use summing functions to determine the total number of matching concurrent and exclusive order scopes, and to determine updated transition and exclusive positions. In the example of FIG. 5, order scope B is entering for Task0 at time T2. Since another order scope B is already being used for Task2, the transition position for order scope B is the second transition position while the transition position for order scope B of Task2 is the first transition position.

Process 828 writes the order scope from the destination RAM module 304 to the source RAM module 306. The information in RAM module 306 will then be subsequently written in CAM module 314. The updated exclusive and transition positions are written to the order scope tables.

Process 830 determines whether the destination order scope is concurrent or non-exclusive. If the destination order scope is concurrent, process 832 releases the destination order scope to indicate the task can begin executing in the destination order scope. If the destination order scope is not concurrent, the order scope is exclusive. A task can only execute in an exclusive order scope when the order scope is in the first exclusive position. Accordingly, process 830 proceeds to process 836 to determine whether the exclusive position of the destination order scope is the first position. If so, process 838 releases the destination order scope to allow the task to begin executing in the destination order scope. If the exclusive position of the destination order scope is not the first position, process 836 waits until the exclusive position of the destination order scope is the first position before proceeding to process 838.

Figure 9:
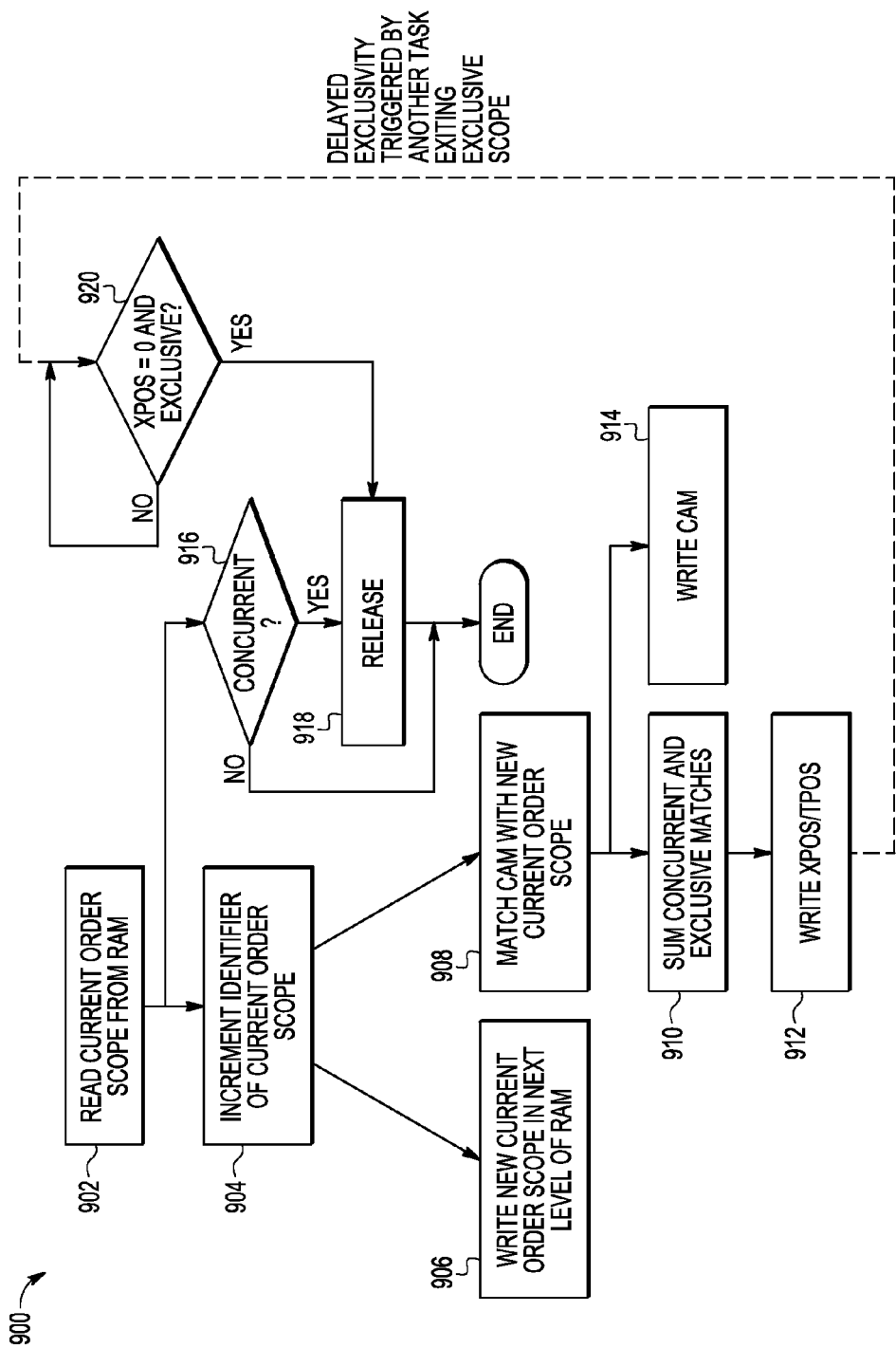
FIG. 9 illustrates a flow diagram of a method for performing an enter incremental command that can be used in the order scope manager of FIG. 3 in accordance with at least one embodiment of the present disclosure.

FIG. 9 illustrates a flow diagram of a method 900 for performing an enter incremental command that can be used in the order scope manager 116 of FIG. 3 in accordance with at least one embodiment of the present disclosure. The enter incremental command is used when an order scope is encapsulated within another order scope. As an example, at time T4, FIG. 5 shows Task0 with order scope C at Level 1 and encapsulated by order scope B at Level 0. The enter incremental command is used to enable Task0 to execute in order scope C from order B.

Process 902 includes reading the current order scope for the requesting task from source RAM module 306. Process 904 includes incrementing the identifier of the current order scope to determine a updated current order scope. The incremented identifier corresponds to a next order scope that is encapsulated or invoked by the current order scope. The identifier of the updated current order scope is written in a next level of the tables in source RAM module 306 in process 906. Process 908 determines whether the updated current order scope matches any of the order scopes for other tasks at that particular time. Process 910 includes summing the number of concurrent order scopes that match the updated current order scope, or the number of exclusive order scopes that match the updated current order scope, depending on whether the updated current order scope is exclusive or concurrent (i.e., non-exclusive). Simultaneously with process 910, process 914 write the updated current order scope in CAM module 314. Subsequent to process 910, process 912 write the transition position, and the exclusive position if applicable, to order scope tables 122.

Simultaneous with processes 904-912, processes 916 and 918 release the current order scope so the task can begin executing in the updated current order scope. Subsequent to process 912, if the updated current order scope is exclusive, process 920 waits until the updated current order scope is in the first exclusive position to release the updated current order scope in process 918 so the requesting task can begin executing in the updated current order scope.

By now it should be appreciated that in some embodiments, there has been provided (FIG. 8) a data processing system that can have a content addressable memory (CAM) wherein each entry of the CAM corresponds to a task and is configured to store a current scope of each task and a random access memory (RAM) configured to shadow information of the CAM. When a command (802) to change scope of a selected task to a destination scope is received, the RAM (806 or 816) can be accessed to determine the current scope of the selected task. The current scope can be used to perform a match determination with the CAM (808 or 818) to determine if any other tasks match the current scope. For any other tasks which result in a match with the current scope, a corresponding age position (TPOS or XPOS) of the matching task within the current scope (810 or 820) is updated.

In another aspect, when the current scope is an exclusive scope, updating a corresponding age position of the matching task within the current scope can comprise decrementing a corresponding exclusive age position (XPOS) of the matching task within the current scope for any other tasks which result in a match with the current scope. (accept —810)

In another aspect, a task having a youngest exclusive position to execute in its current scope can be released.

In another aspect, updating a corresponding age position of the matching task within the current scope can comprise, for any other tasks which result in a match with the current scope, decrementing a corresponding transition age position of the matching task within the current scope. (exit—820)

In another aspect, the steps of accessing the RAM, using the current scope to perform a match determination, and decrementing the corresponding transition position are performed when a corresponding transition position of the selected task becomes a youngest transition age position within the current scope. (exit—yes branch of 812 Yes)

In another aspect, the destination scope can be used to perform a match determination with the CAM to determine if any other tasks match the destination scope (824). For any other tasks which result in a match with the destination scope, a corresponding transition age position (826) can be updated.

In another aspect, the destination scope is used to perform a match determination with the CAM to determine a count of matching entries in the CAM.

In another aspect, the CAM and the RAM are updated to store the destination scope as the current scope of the selected task. The count corresponds to a transition age position of the destination scope.

In another aspect, when the destination scope is exclusive, the count corresponds to an exclusive age position of the destination scope.

In another aspect, the command to change scope of the selected task can comprise a transition command to transition the scope of the selected task, and during an accept phase of the transition, updating the corresponding age position of the matching task within the current scope can comprise updating an exclusive age position of the matching task within the current scope.

In another embodiment, a data processing system can have a content addressable memory (CAM) wherein each entry of the CAM corresponds to a task and is configured to store a current scope of each task and a random access memory (RAM) configured to shadow information of the CAM. A command to change scope of a selected task is received and the RAM (902) is accessed to determine the current scope of the selected task. The current scope (904) is updated. The updated current scope is used to perform a match determination with the CAM to determine a number of entries in the CAM corresponding to tasks other than the selected task which match the updated current scope; (908, 910). The CAM and the RAM are updated to store the updated current scope as the current scope of the selected task (906/914). The number of entries is used to update a transition age position (TPOS) of the updated scope which is stored as the current scope of the selected task. (912)

In another aspect, when the current scope of the selected task is exclusive, the updated current scope can be used to perform a match determination with the CAM to determine a second number of entries in the CAM corresponding to exclusive tasks other than the selected task which match the updated current scope. The second number of entries can be used to update an exclusive age position (XPOS) of the updated scope which is stored as the current scope of the selected task. (910, 912)

In another aspect, the command to change scope of the selected task can include a command for the selected tasks to enter an incremental scope.

In further embodiments, a data processing system can include a content addressable memory (CAM) (314) wherein each entry of the CAM can correspond to a task and is configured to store a current scope of each task. A random access memory (RAM) (304) can be configured to shadow information of the CAM.

Transition position storage circuitry (322) can be configured to store transition age positions for tasks. Control circuitry (124) can be configured to, in response to a command to transition a selected task to a destination scope, access the RAM to determine the current scope for the selected task, (806 or 816) use the current scope to perform a match determination with the CAM to determine if any entries corresponding to tasks other than the selected task match the current scope, (808 or 818) and for any matching entries, update a transition age position in the transition position storage circuitry for the corresponding task within the current scope. (820)

In another aspect, exclusive position storage circuitry (324) can be configured to store exclusive age positions for tasks. The control circuitry can be further configured to, when the current scope is an exclusive scope, for any matching entries, update an exclusive age position in the transition position storage circuitry for the corresponding task within the current scope (810).

In another aspect, the control circuitry can be further configured to release a task having a youngest exclusive age position to execute in its current scope.

In another aspect, a destination random access memory (RAM) can be configured to store destination scopes for tasks.

In another aspect, the control circuitry can be further configured to use the destination scope to perform a match determination with the CAM to determine if any entries corresponding to tasks other than the selected task match the destination scope. For any matching entries resulting from using the destination scope to perform the match determination with the CAM, a transition age position is updated in the transition position storage circuitry of the corresponding task within the current scope.

In another aspect, the control circuitry can be further configured to store the destination scope to the CAM and the RAM as the current scope of the selected task.

In another aspect, the control circuitry can be further configured to, when using the destination scope to perform a match determination with the CAM, determine a count of matching entries. The count can be used to update a transition age position of the destination scope which is stored as the current scope of the select task. (part of 828)

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are circuitry located on a single integrated circuit or within a same device. Alternatively, system 100 may include any number of separate integrated circuits or separate devices interconnected with each other. For example, memory may be located on a same integrated circuit processor 102 or on a separate integrated circuit or located within another peripheral or slave discretely separate from other elements of system 100. Peripheral and I/O circuitry may also be located on separate integrated circuits or devices. Also for example, system 100 or portions thereof may be soft or code representations of physical circuitry or of logical representations convertible into physical circuitry. As such, system 100 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. In a data processing system having a content addressable memory (CAM) wherein each entry of the CAM corresponds to a task and is configured to store a current scope of each task and a random access memory (RAM) configured to shadow information of the CAM, a method comprising:
    receiving a command to change scope of a selected task to a destination scope;
    accessing the RAM to determine the current scope of the selected task;
    using the current scope to perform a match determination with the CAM to determine if any other tasks match the current scope; and
    for any other tasks which result in a match with the current scope, updating a corresponding age position of the matching task within the current scope.

2. The method of claim 1, wherein when the current scope is an exclusive scope, the updating a corresponding age position of the matching task within the current scope comprises:
    for any other tasks which result in a match with the current scope, decrementing a corresponding exclusive age position of the matching task within the current scope.

3. The method of claim 2, further comprising:
    releasing the matching task having a youngest exclusive age position among the matching tasks to execute in the matching task's current scope.

4. The method of claim 1, wherein the updating a corresponding age position of the matching task within the current scope comprises:
    for any other tasks which result in a match with the current scope, decrementing a corresponding transition age position of the matching task within the current scope.

5. The method of claim 4, wherein the steps of accessing the RAM, using the current scope to perform a match determination, and decrementing the corresponding transition position are performed when a corresponding transition position of the selected task becomes a youngest transition age position within the current scope.

6. The method of claim 5, further comprising:
    using the destination scope to perform a match determination with the CAM to determine a count of matching entries in the CAM.

7. The method of claim 6, further comprising:
    update the CAM and the RAM to store the destination scope as the current scope of the selected task, wherein the count corresponds to a transition age position of the destination scope.

8. The method of claim 7, wherein when the destination scope is exclusive, the count corresponds to an exclusive age position of the destination scope.

9. The method of claim 1, wherein the command to change scope of the selected task comprises a transition command to transition the scope of the selected task, and wherein during an exit phase of the transition, the updating the corresponding age position of the matching task within the current scope comprises updating a transition age position of the matching task within the current scope.

10. The method of claim 1, wherein the command to change scope of the selected task comprises a transition command to transition the scope of the selected task, and wherein during an accept phase of the transition, the updating the corresponding age position of the matching task within the current scope comprises updating an exclusive age position of the matching task within the current scope.

11. In a data processing system having a content addressable memory (CAM) wherein each entry of the CAM corresponds to a task and is configured to store a current scope of each task and a random access memory (RAM) configured to shadow information of the CAM, a method comprising:
    receiving a command to change scope of a selected task;
    accessing the RAM to determine the current scope of the selected task;
    updating the current scope;
    using the updated current scope to perform a match determination with the CAM to determine a number of entries in the CAM corresponding to tasks other than the selected task which match the updated current scope;
    update the CAM and the RAM to store the updated current scope as the current scope of the selected task; and
    using the number of entries to update a transition age position of the updated scope which is stored as the current scope of the selected task.

12. The method of claim 11, further comprising:
    when the current scope of the selected task is exclusive, using the updated current scope to perform a match determination with the CAM to determine a second number of entries in the CAM corresponding to exclusive tasks other than the selected task which match the updated current scope; and
    using the second number of entries to update an exclusive age position of the updated scope which is stored as the current scope of the selected task.

13. The method of claim 11, wherein the command to change scope of the selected task comprises a command for the selected tasks to enter an incremental scope.

14. A data processing system, comprising:
    a content addressable memory (CAM) wherein each entry of the CAM corresponds to a task and is configured to store a current scope of each task;
    a random access memory (RAM) configured to shadow information of the CAM;
    transition position storage circuitry configured to store transition age positions for tasks; and
    control circuitry configured to, in response to a command to transition a selected task to a destination scope:
        access the RAM to determine the current scope for the selected task;
        use the current scope to perform a match determination with the CAM to determine if any entries corresponding to tasks other than the selected task match the current scope; and
        for any matching entries, updating a transition age position in the transition position storage circuitry for the corresponding task within the current scope.

15. The data processing system of claim 13, further comprising:
    exclusive position storage circuitry configured to store exclusive age positions for tasks;
    wherein the control circuitry is further configured to:
        when the current scope is an exclusive scope, for any matching entries, updating an exclusive age position in the transition position storage circuitry for the corresponding task within the current scope.

16. The data processing system of claim 14, wherein the control circuitry is further configured to release the matching task having a youngest exclusive age position among the matching tasks to execute in the matching task's current scope.

17. The data processing system of claim 14, further comprising:

a destination random access memory (RAM) configured to store destination scopes for tasks.

18. The data processing system of claim 17, wherein the control circuitry is further configured to:
use the destination scope to perform a match determination with the CAM to determine if any entries corresponding to tasks other than the selected task match the destination scope; and
for any matching entries resulting from using the destination scope to perform the match determination with the CAM, updating a transition age position in the transition position storage circuitry of the corresponding task within the current scope.

19. The data processing system of claim 18, wherein the control circuitry is further configured to:
store the destination scope to the CAM and the RAM as the current scope of the selected task.

20. The data processing system of claim 19, wherein the control circuitry is further configured to:
when using the destination scope to perform a match determination with the CAM, determine a count of matching entries; and
use the count to update a transition age position of the destination scope which is stored as the current scope of the select task.

* * * * *